Jan. 23, 1973 D. GRAZIANI 3,712,994

AUTOMATIC TIME CONTROL CIRCUIT

Filed July 20, 1971 4 Sheets-Sheet 1

Inventor
DANIO GRAZIANI
By [signature]
Agent

Inventor
DANIO GRAZIANI
By
Agent

Inventor
DANIO GRAZIANI
By [signature]
Agent

Jan. 23, 1973 D. GRAZIANI 3,712,994

AUTOMATIC TIME CONTROL CIRCUIT

Filed July 20, 1971 4 Sheets-Sheet 4

Inventor
DANIO GRAZIANI
By Vincent B. Ingrassia
Agent 3,712,994

AUTOMATIC TIME CONTROL CIRCUIT

Danio Graziani, Milan, Italy, assignor to International Standard Electric Corporation, New York, N.Y.

Filed July 20, 1971, Ser. No. 164,372
Int. Cl. H03k *17/26*
U.S. Cl. 307—293 3 Claims

ABSTRACT OF THE DISCLOSURE

This invention relates to an automatic time control circuit. The time delay of an adjustable time delay circuit is controlled by an error voltage which is derived from the continuous comparison of the time delay with another time obtained from a very stable source such as a crystal oscillator.

BACKGROUND OF THE INVENTION

This invention relates to stabilized time delay circuits in general and more particularly to circuits which permit the delay time between one action and another to be maintained within a high degree of accuracy by continuous adjustment against a timing reference.

In electronic circuits, the time delay between one action and another or between a cause and an effect is usually obtained by conventional delay lines or so-called "flip-flop" logic. Both of these suffer from certain instability, either temporary due to temperature and supply voltage variations, or long term due to drift of electronic components being used. Almost always these delay circuits are connected to other additional electronic circuits, the latter having the function of processing signals and making them suitable to undergo the established delay. These associated circuits also exhibit certain instabilities which, as stated above, are due to temperature, supply voltage and time alteration effects on the components thereof. In certain demanding applications the total time delay obtained with the above-mentioned prior art circuits, while being adjustable within certain limits, is not sufficiently stable enough.

SUMMARY OF THE INVENTION

It is the general object of the present invention to provide automatic time delay control circuit with improved stability. This circuit may find particular use in DME (distance measuring equipment), tacan and radar systems where the nature of the apparatus suggests the use of such an ATC (automatic time control) circuit.

According to a broad aspect of the invention, there is provided an automatic time delay control circuit comprising an adjustable delay circuit for imparting a predetermined delay to an input signal, means for generating a stable reference delay signal, and comparing means coupled to said adjustable delay circuit and said generating means for producing a control voltage which adjusts said adjustable delay circuit.

In the specific case of DME ground equipment, it is known that the reply of the ground radio beacon to an interrogating aircraft must be given continuously with a fixed delay time equal to 50 microseconds. A system requirement determined by the use of the DME system for the aircraft approach and landing, necessitates that this fixed delay be maintained with great accuracy, thereby permitting very accurate distance measurements to be made. The circuit according to this invention, as used in DME ground equipment, permits the continuous control of this 50 microsecond delay and carries out a continuous correcting action to prevent this value from departing from selected tolerance limits. The degree of stability only obtained is a function of a few circuit parameters, as described hereinbelow.

The above and other aspects of the present invention will be better understood from the following detailed description taken in conjunction with the accompanying drawings:

DESCRIPTION OF THE PREFERRED EMBODIMENTS

Figure 1:
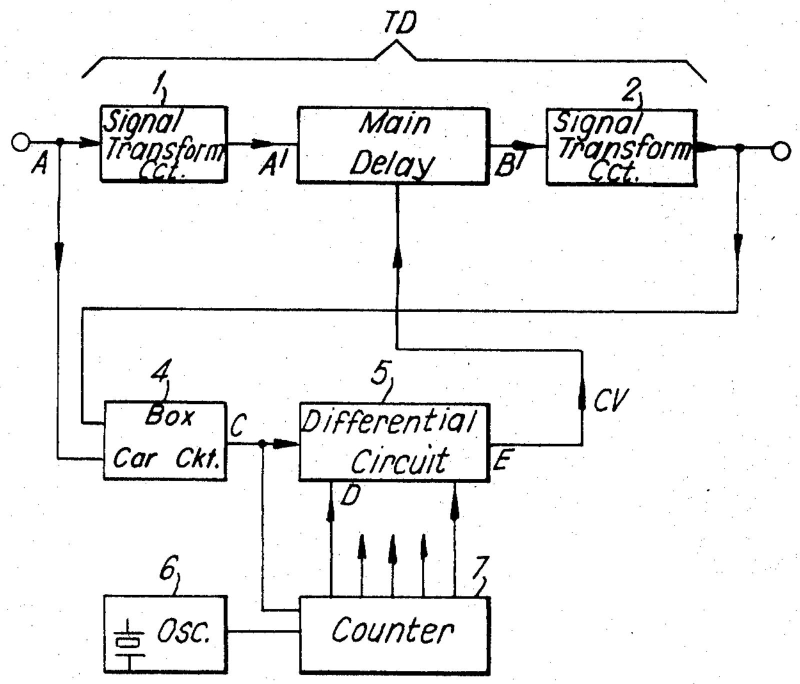
FIG. 1 shows a block diagram of a complete delay circuit provided with automatic time control (ATC) according to the invention.
Figure 2:
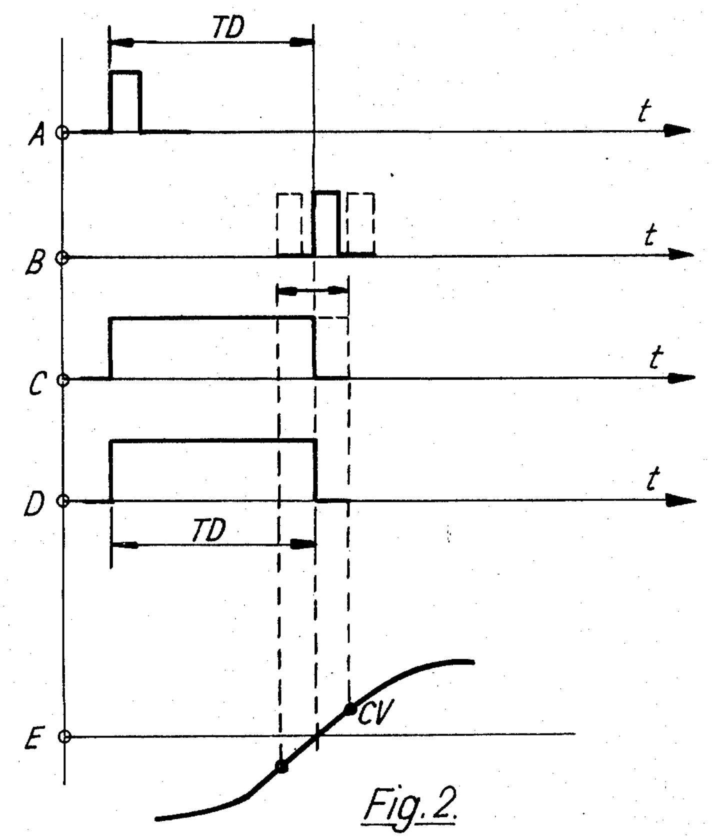
FIG. 2 shows the types of signals at the main points of the above-mentioned circuit.

It will be assumed that a total delay TD between the points A and B in FIG. 1 is to be maintained. Both the input signals (A) and the output signals (B) are pulses, of 3 microseconds duration which succeed each other at a repetition rate of 100 pulses per second (FIG. 2). Circuits 1 and 2 are typical signal processing circuits which cause additional incidental delays as stated above, and 3 is a circuit where the intentional man delay occurs. Circuit 3 is capable of having controlled adjustment. Such circuits for delay as 3 circuits can readily supply a total delay TD, say of 50 microseconds, but do not have acceptable stability. Such stability may be made acceptable, however as required in certain exacting applications, by adding circuits 4, 5, 6, 7 in FIG. 1. The box car (bistable) circuit 4 receives the input and output pulses (FIG. 2A and B) delayed, one to another, by a nominal value equal to 50 microseconds and supplies a single pulse C, as shown in FIG. 2C, which is nominally 50 microseconds long, but is affected by instability of circuits 1+2+3. Circuit 6 is a high stability quartz oscillator which generates time sample signals at fixed intervals. By using a quartz cut for a 50 mHz. frequency such intervals are of 20 nanoseconds, with quartz of 25 mHz. intervals of 40 nanoseconds are obtained and so on. The circuit 7 is a counter which may set to give a D output pulse exactly 40 nonoseconds long with a tolerance of $\pm 1$ count, i.e. $\pm 20$ or 50 nanoseconds depending upon the quartz selected (see FIG. 2D). Such pulse is repeated 100 times per second such as is the one at C, it being the signal C itself which triggers the pulse D. The two signals C and D thus obtained are applied to the differential circuit 5; from this comparison, repeated 100 times per second a control voltage CV is obtained, which corrects delay circuit 3 whenever it departs from the established value (FIG. 2E). The comparison in 5 may be thought of as a waveform area comparison. The final result is that, at each repetition of the total line TD (as detected by differential circuit 5) at every 10 milliseconds (PRF=100 Hz.) a corresponding control (feedback) voltage CV is obtained which adjusts TD to the correct value with a tolerance mainly depending upon the various parameters of the ATC circuit, e.g.

stability of the crystal oscillator,
frequency of the crystal oscillator,
slope of the $\Delta t/\Delta V$ characteristic of the differential circuit 5, and
slope of the $\Delta V/\Delta t$ characteristic of the delay circuit 3.

Figure 3A:
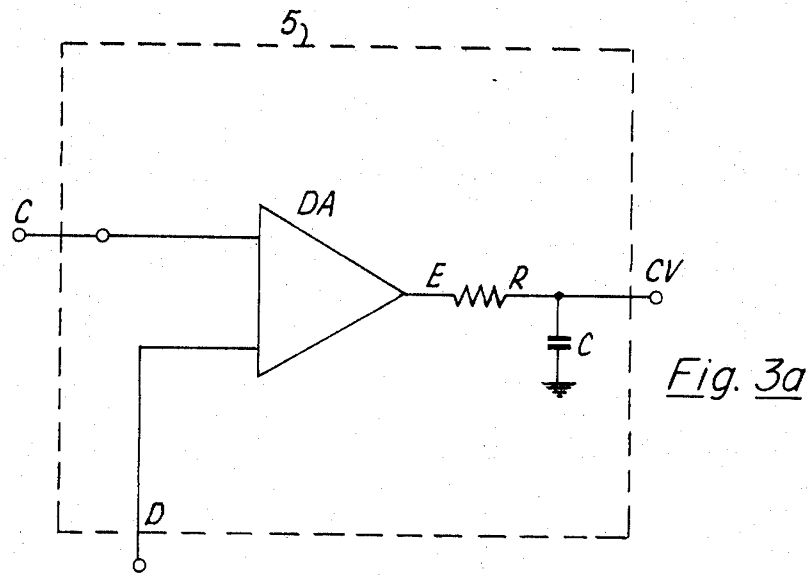
FIG. 3 explains the operational principle of the circuit portion providing the delay controlling voltage, FIG. 3a being a detail of circuit 5 and FIG. 3b showing related waveforms.

FIG. 3 shows how the said control voltage can be obtained in 5. The circuit DA is a differential amplifier, to the two inputs of which the signals C and D are applied with a time rate of 100 times per second. The output signal E from DA is still an impulse type signal and with duration equal to the time difference existing between C and D, with a repetition frequency of 100 Hz. and a constant level.

Figure 3B:
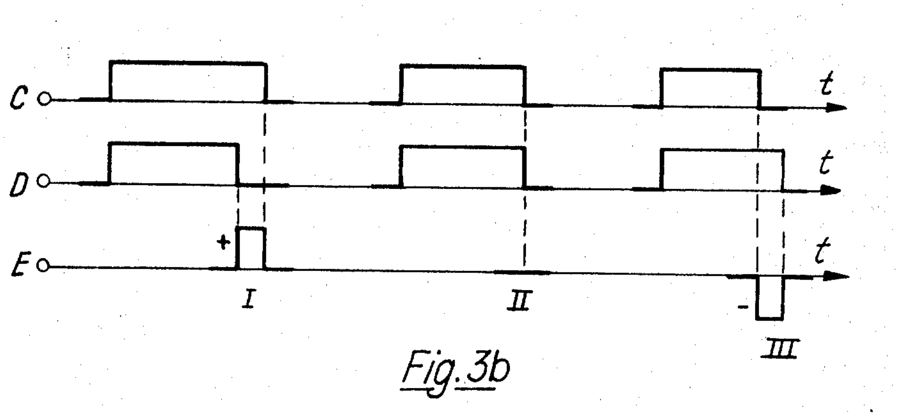

Three significant cases I, II and III are illustrated; FIG. 3*b*, in the first instance, assuming C to be of longer duration than D, positive pulses E are obtained at I. In the second (II), if C equals D, E is zero. In the third one (III), if D is greater than C, negative pulses E are obtained. By providing an output integrating circuit RC (FIG. 3E*a*), since positive or negative pulses E are repeated 100 times per second, a potential CV will be obtained (by integration) slowly varying near zero and having a negative or positive amplitude proportional to the time difference existing between C and D, i.e. between the unstable delay time and the accurate reference time.

Figure 4:
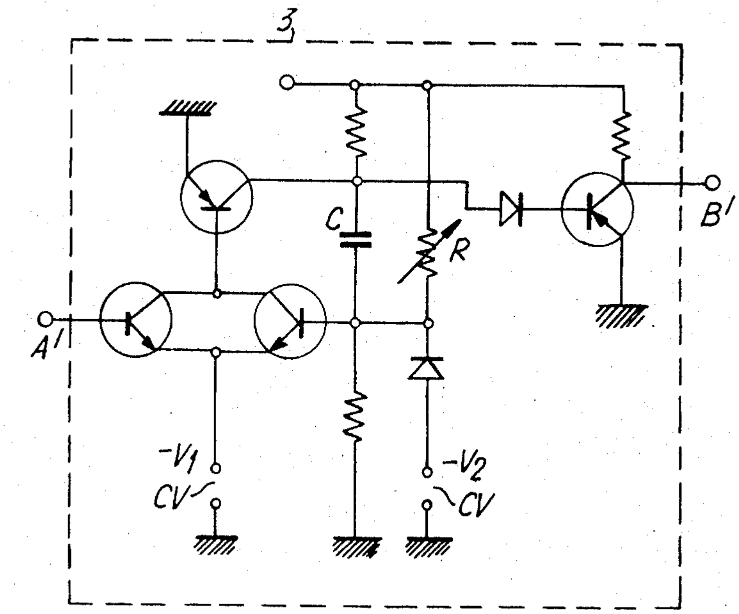
FIG. 4 illustrates how the control voltage acts on the delay circuits 3 while correcting the time thereof.

FIG. 4 shows in detail a typical "flip-flop" circuit of the type used to obtain an adjustable delay. The circuit comprises among other components a variable resistor R and two biasing voltages $V_1$ and $V_2$.

Since R together with C determines the time constant of the circuit, when R varies, the delay time is changed. If the control voltage CV is caused to vary in the right direction, parameters may be arranged in such a manner that the delay time follows the value of CV so as to compensate continuously and automatically for possible instabilities detected at DA. The resistor R or a portion thereof may consist of a field effect transistor which may function as a variable resistor with the voltage thereof applied to the gate.

A similar effect of varying the delay time may be produced by acting on the value of $V_1$ or $V_2$, but according to a different law and taking advantage of the discharge time of C.

It is to be understood that the foregoing description of specific examples of this invention is made by way of example only and is not to be considered as a limitation on its scope.

I claim:

1. A stabilized pulse time delay circuit comprising:

a delay device having pulse input and output terminals, said delay device producing a pulse delay which is a function of an applied control signal;

first gate means responsive to the pulses at said input and output terminals to generate a first gate having a duration equal to the time between pulses at said input and output terminals;

an oscillator having a frequency high enough to produce a relatively large number of cycles within the time duration of said first gate;

second gate means including means responsive to said oscillator and said first gate means to produce a second gate beginning substantially at the leading edge of said first gate and having a duration equal to a predetermined number of cycles of said oscillator;

differential means for comparing said first and second gates to produce said control signal as a function of the difference in duration of said first and second gates and for applying said control signal to said delay device for controlling the duration of said first gate toward equality with the duration of said second gate.

2. Apparatus according to claim 1 in which said second gate means includes a counter connected to be initiated by the leading edge of said first gate to count a predetermined number of cycles of said oscillator and to terminate said second gate when said predetermined count is reached.

3. Apparatus according to claim 2 in which said differential means includes means for producing a difference pulse of a first polarity corresponding to a difference in duration of said first and second gates of a first algebraic sign and of a second polarity corresponding to said difference having a second algebraic sign, and including integrating means for integrating said difference pulse to produce said control signal in corresponding polarity.

References Cited

UNITED STATES PATENTS

| | | | |
|---|---|---|---|
| 3,008,087 | 11/1961 | Darwin | 328—55 X |
| 3,172,044 | 3/1965 | McGuire | 328—55 |
| 3,202,769 | 8/1965 | Coleman, Jr. | 328—55 X |
| 3,206,686 | 9/1965 | Goor | 328—55 X |
| 3,558,933 | 1/1971 | Meyer | 307—293 |
| 3,133,210 | 5/1964 | Leurgans | 307—293 X |
| 3,260,864 | 7/1966 | Nourney | 307—293 |
| 3,403,268 | 9/1968 | Bleckner et al. | 307—293 |

STANLEY D. MILLER, Jr., Primary Examiner

U.S. Cl. X.R.

328—55